United States Patent [19]

Shibata et al.

[11] Patent Number: 5,584,724

[45] Date of Patent: Dec. 17, 1996

[54] ELECTRICAL JUMPER CONNECTOR UNIT HAVING SHELL AND MECHANISM FOR ENABLING TO ADJUST CONNECTION ALIGNMENT

[75] Inventors: Junichiro Shibata; Yosuke Kuroki; Kyosuke Takeuchi; Yasufumi Hayashi; Osamu Takagi, all of Tokyo, Japan

[73] Assignee: NEC Corporation, Tokyo, Japan

[21] Appl. No.: 391,067

[22] Filed: Feb. 21, 1995

[30] Foreign Application Priority Data

Feb. 24, 1994 [JP] Japan .................................. 6-026741

[51] Int. Cl.⁶ .................................................. H01R 31/08
[52] U.S. Cl. ........................... 439/507; 439/640; 439/248
[58] Field of Search ................................. 439/640, 507, 439/246, 248

[56] References Cited

U.S. PATENT DOCUMENTS

4,950,178   8/1990   Harvey et al. ........................ 439/507
5,192,226   3/1993   Wang ..................................... 439/640
5,466,172   11/1995  Carstens et al. ...................... 439/640

Primary Examiner—P. Austin Bradley
Assistant Examiner—Jill DeMello
Attorney, Agent, or Firm—Young & Thompson

[57] ABSTRACT

In an electrical jumper connector unit having two connectors connecting two electronic circuit boards included in an information processing apparatus, there are a first connector, a plate, a second connector fixed on the plate, and plural discrete cables connecting both the two connectors in a shell las a casing of the electrical jumper connector unit. The plate is included in the shell so as to move in any direction within a predetermined range relative to the shell, and a pair of knobs is fixed to the plate so as to protrude from a pair of openings of the shell. When the pair of the knobs moves in any direction within the predetermined range to the shell, the second connector fixed to the plate moves in the same way. When the second connector fixed to the plate agrees with an external output connector fixed on one of the two electronic circuit boards, the motion of the pair of the knobs discontinues.

10 Claims, 7 Drawing Sheets

ELECTRICAL JUMPER CONNECTOR UNIT HAVING SHELL AND MECHANISM FOR ENABLING TO ADJUST CONNECTION ALIGNMENT

BACKGROUND OF THE INVENTION

1. Field of Invention

This invention relates to an electrical jumper connector unit for electrically connecting between two external electrical connector elements mounted in an electronic apparatus such as information processing apparatus or a personal computer.

2. Description of the Related Art

In the manner which will later be described more in detail, a conventional jumper connector unit comprises two electrical connector elements and a cable connecting the two connector elements with each other.

One of the two connector elements is mated with a first external connector element mounted on, for example a circuit board contained in the personal computer, while the other connector element is mated with a second external connector element mounted on another circuit board in the same personal computer, so that the first and the second external connector elements are connected to each other through the jumper connector unit. Thus, the two circuit boards are electrically connected to each other by means of the jumper connector unit.

In the condition, the cable is exposed and extends outside the electronic device with or without a curved portion. The outside extending cable portion makes an obstacle which any person or any one could carelessly catch, thus leading to an accident.

Generally speaking, the connector elements and the first and the second external connector elements are multi-contact ones each having a plurality of contacts. The cable connecting the two connector elements with each other comprises a plurality of conductors each connecting one of contacts in one of the two connector elements and a corresponding one of contacts in the other of two connector elements. Those conductors are insulated from one another but are bundled together covered with an insulating sheath to form a single cable. The single cable is therefore comparatively large in diameter and hard in rigidity. Therefore, when the jumper connector unit is used for connecting the first and the second connector elements disposed in the vicinity with each other as often seen in the personal computer, the cable is required to be comparatively long so that the curved portion becomes comparatively large to permit the two connector elements to be mated with the first and the second external connector elements disposed in the vicinity of each other. In the case, existence of the large curved portion renders the conventional jumper connector unit more bulky and dangerous.

Further, the conventional jumper connector unit is complicated in handling because the exposed cable, in particular, the curved portion thereof, can be caught by any one.

SUMMARY OF THE INVENTION

It is consequently an object of this invention to provide an electrical jumper connector unit with a compact structure.

It is another object of this invention to provide an electrical jumper connector unit with a safe structure.

It is still another object of the present invention to provide an electrical jumper connector unit which is easy to handle.

It is yet another object of the present invention to provide an electrical jumper connector unit having a shell or case and a mechanism to enable the adjustment of connection alignment.

Other objects of this invention will become clear as the description proceeds.

According to this invention, there is provided an electrical jumper connector unit for connecting two electronic circuit boards included in an information processing apparatus, the electrical jumper connector unit comprising a shell or case, a first connector fixed in the shell, a plate included in the shell so as to move in any directions within a predetermined range to the shell, a second connector fixed on the plate, plural loose cables connecting both the two connectors, and knobs fixed to the plate so as to protrude from the shell.

DESCRIPTION OF THE PREFERRED EMBODIMENT

Figure 1:
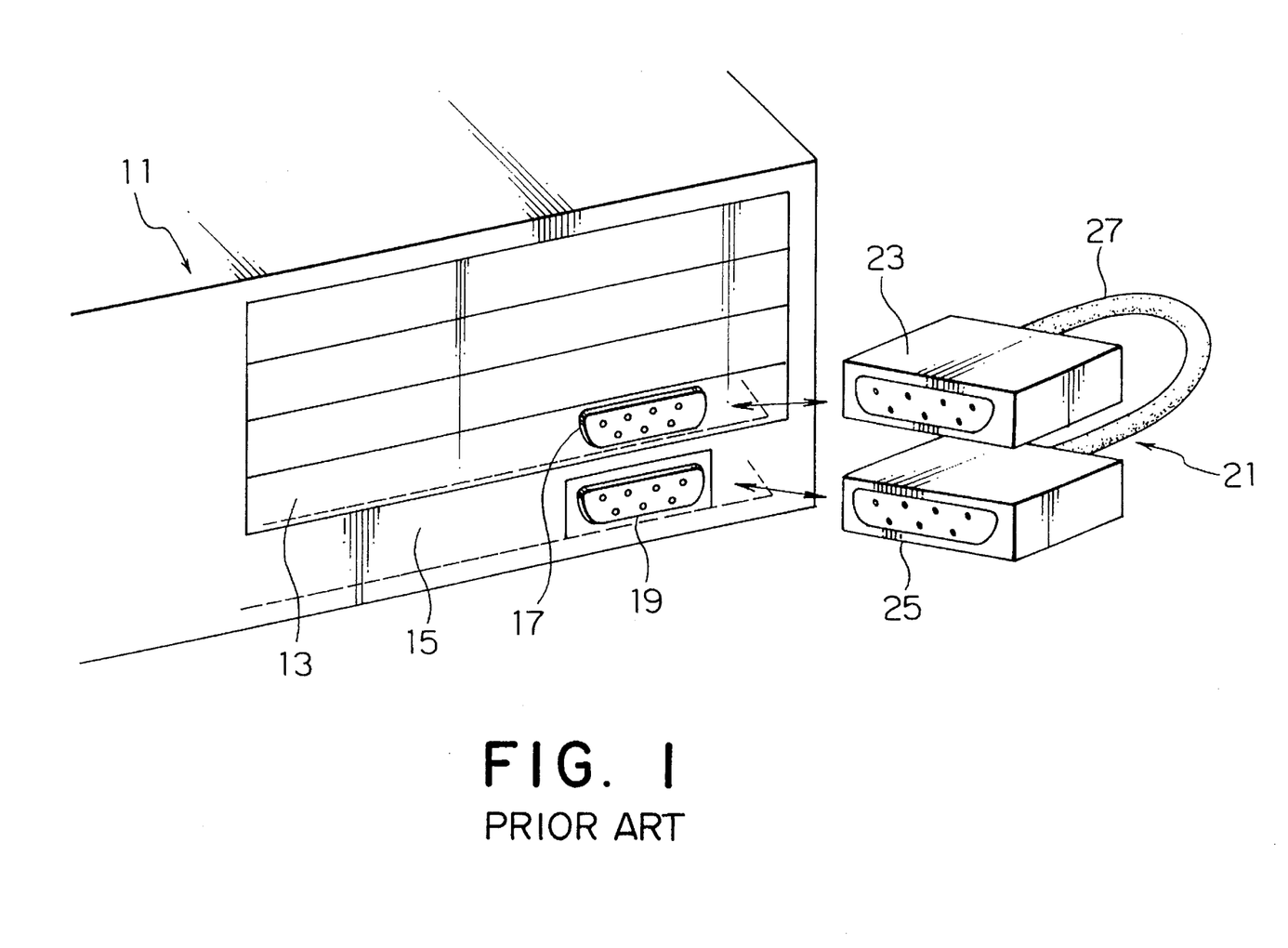
FIG. 1 is a perspective view of a conventional jumper connector unit and an information processing apparatus.

Referring to FIG. 1, a conventional jumper connector unit will first be described in order to facilitate an understanding of this invention.

The conventional jumper connector unit 21 comprises two connectors 23 and 25, and a curved external shielding cable 27. One end of the curved external shielding cable 27 is electrically attached to the connector 23, and the other end of the curved external shielding cable 27 is electrically attached to the connector 25.

An information processing apparatus 11 has two electronic circuit boards 13 and 15, and others. Two external output connectors 17 and 19 are fixed on the two electronic circuit boards 13 and 15 respectively.

The conventional jumper connector unit 21 is used in order to connect two electronic circuit boards 13 and 15 of the information processing apparatus 11, namely, the two connectors 23 and 25 connect to the two external output connectors 17 and 19 respectively, as indicated by two arrows in FIG. 1.

It is necessary to take an exclusive equipment for processing both ends of the curved external shielding cable 27. The extra length of the curved external shielding cable 27 is needed approximately from eight to twelve inches for setting the curved external shielding cable 27 to the exclusive equipment. When the conventional jumper connector 21 is connected to the information processing apparatus 11, the curved external shielding cable 27 protrudes from the information processing apparatus 11. The protruding portion of the curved external shielding cable 27 makes an obstacle, in other words, a dead space. If someone catches carelessly the protruding portion of the curved external shielding cable 27, an accident will occur.

In the jumper connector unit being illustrated, the curved external shielding cable 27 protrudes from the information processing apparatus 11. This renders the conventional jumper connector unit bulky and dangerous.

Figure 2:
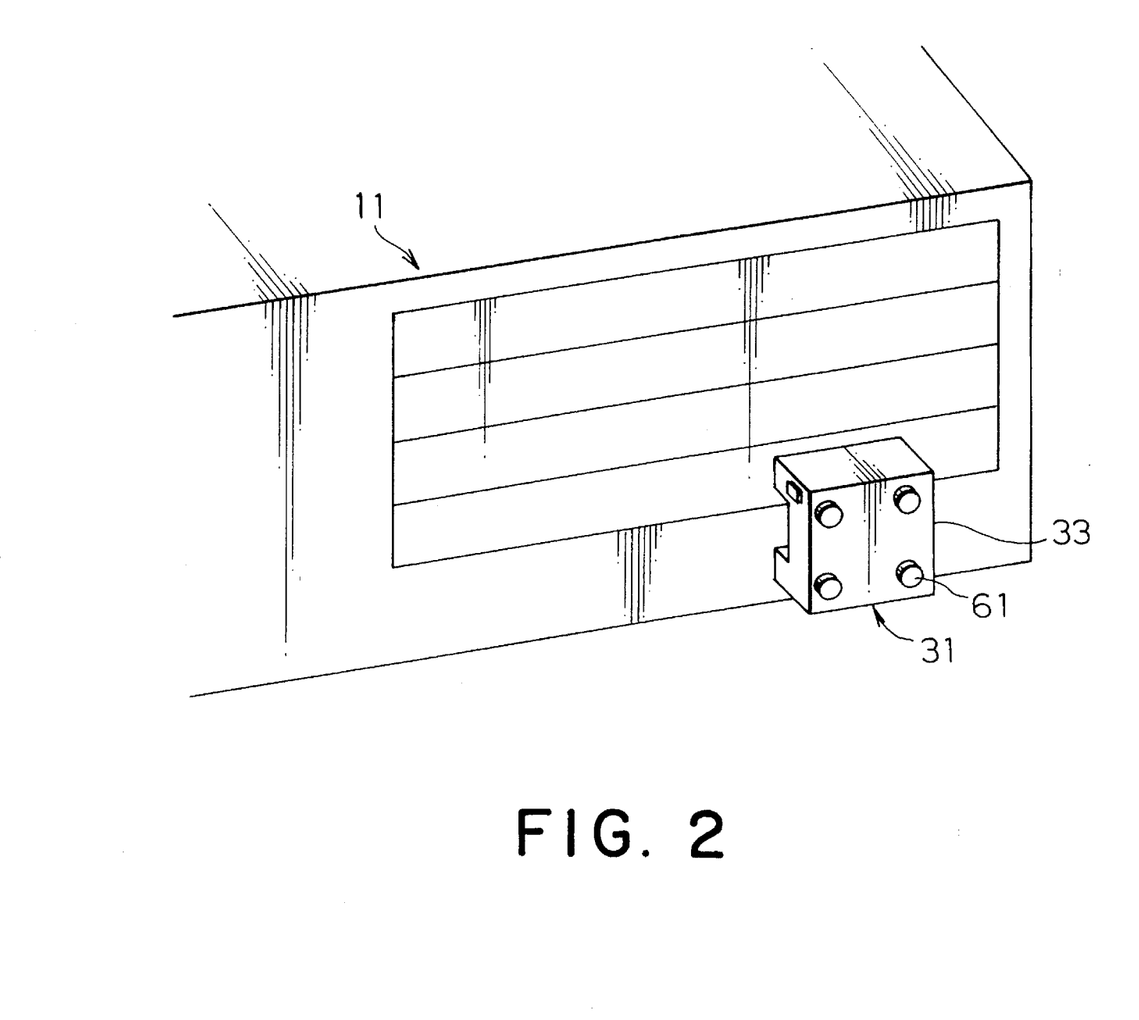
FIG. 2 is a schematic perspective view of an electrical jumper connector unit according to an embodiment of this invention installed on the information processing apparatus.
Figure 3:
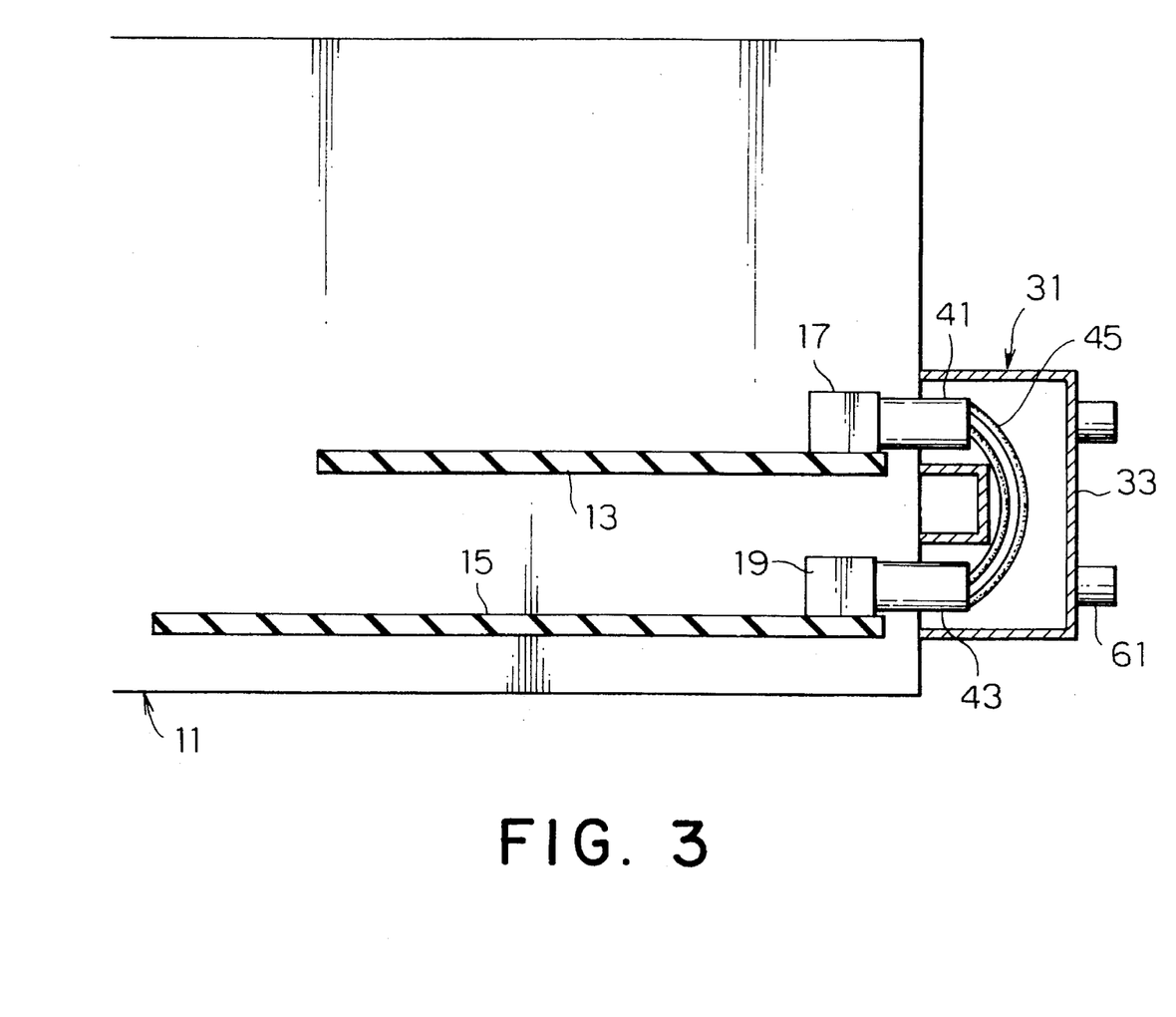
FIG. 3 is a schematic vertical sectional view of the electrical jumper connector unit according to the embodiment of this invention installed on the information processing apparatus.
Figure 4:
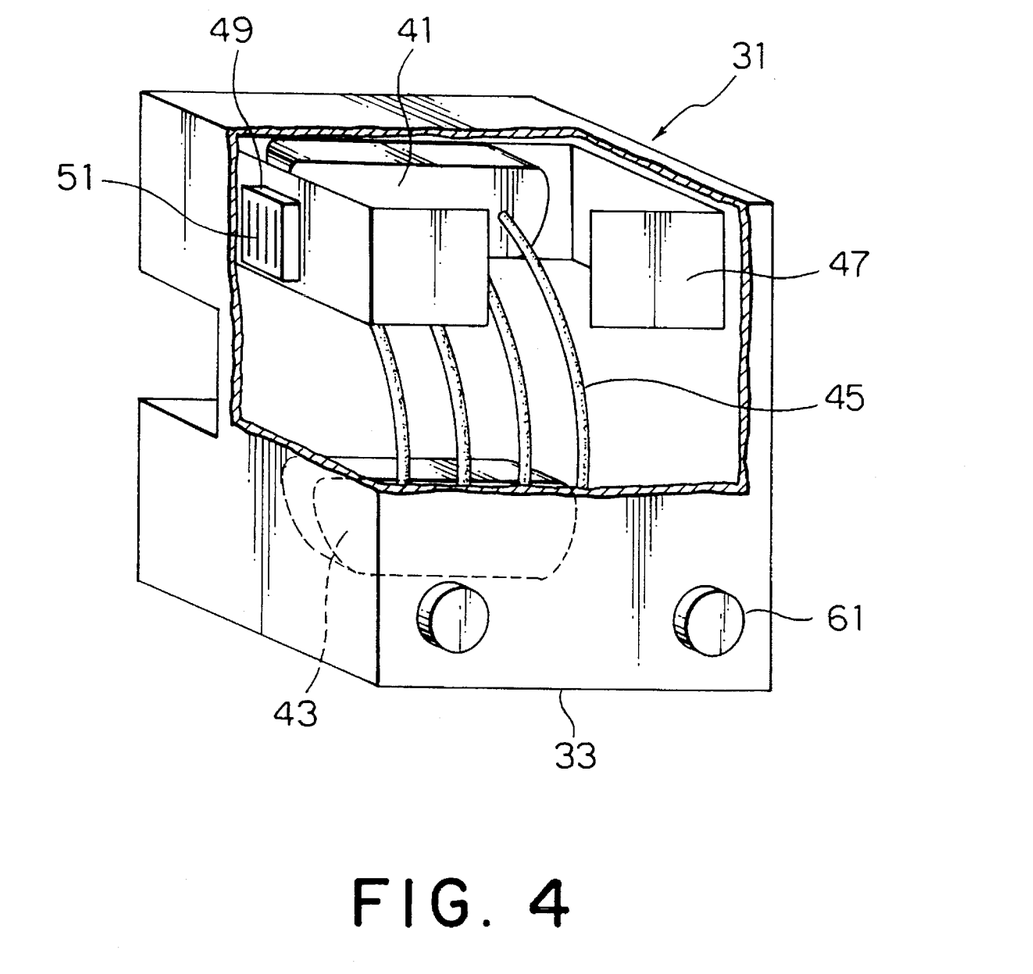
FIG. 4 is a schematic partially broken perspective view of the electrical jumper connector unit according to the embodiment of this invention.

Referring now to FIGS. 2 and 3, the description will proceed to an electrical jumper connector unit according to a preferred embodiment of this invention.

In FIG. 2, a conductive shell or case 33 of the electrical jumper connector unit 31 is fastened to the information processing apparatus 11 by means of four screws 61.

In FIG. 3, there are plural external output connectors at the back portion of the information processing apparatus 11. Two connectors 41 and 43 of the electrical jumper connector unit 31 connect to an external output connector 17 fixed on an electronic circuit board 13 and an external output connector 19 fixed on an electronic circuit board 15 respectively. Plural discrete cables 45 connect between the two connectors 41 and 43 shortestly.

Referring now to FIGS. 4, 5, 6, 7, and 8, the detailed description will proceed to the electrical jumper connector unit 31.

Figure 5:
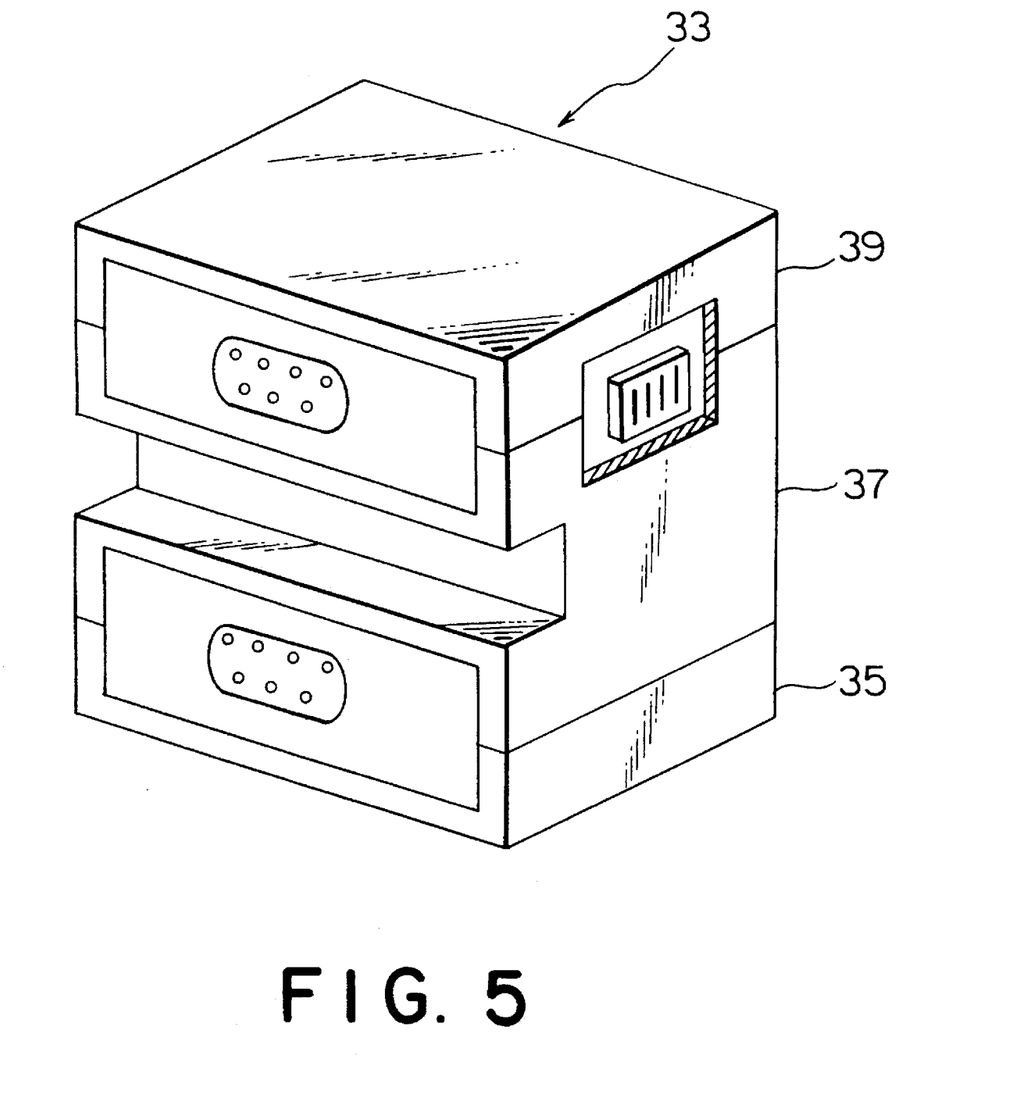
FIG. 5 is a perspective view of the electrical jumper connector unit according to the embodiment of this invention.

The conductive shell or case 33 comprises a lower shell or case 35, a middle shell or case 37, and an upper shell or case 39, as shown in FIG. 5.

Figure 6:
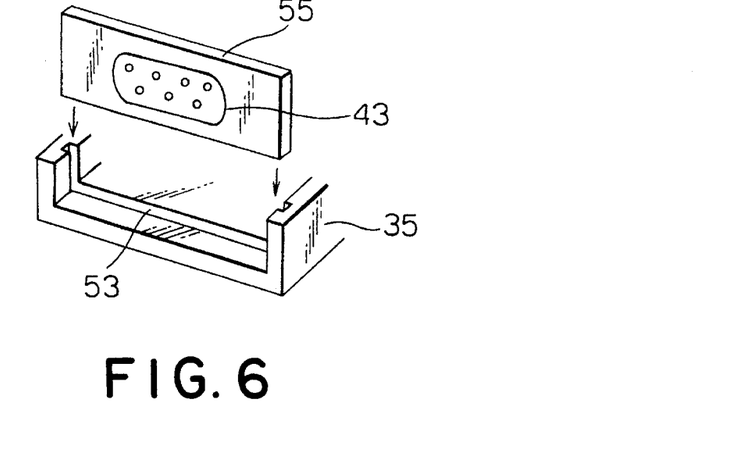
FIG. 6 is an exploded perspective view of a lower shell and a panel of the electrical jumper connector unit according to the embodiment of this invention.

The lower shell 35 has a groove 53, and the connector 43 is fixed to a panel 55, as shown in FIG. 6. The lower portion of the panel 55 is inserted into the groove 53 of the lower shell 35, as indicated by two arrows in FIG. 6. The upper portion of the panel 55 is inserted into a groove (not shown) of the middle shell 37.

Figure 7:
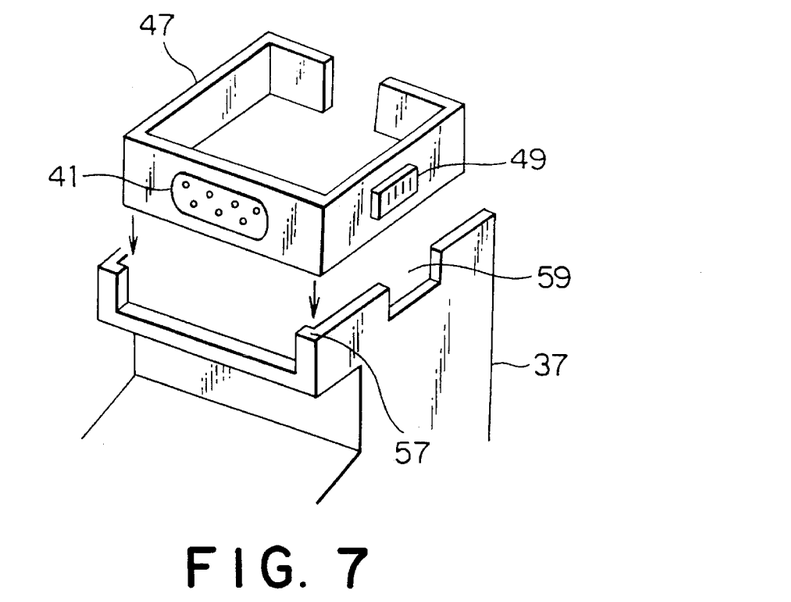
FIG. 7 is an exploded perspective view of a middle shell and a plate of the electrical jumper connector unit according to the embodiment of this invention.
Figure 8:
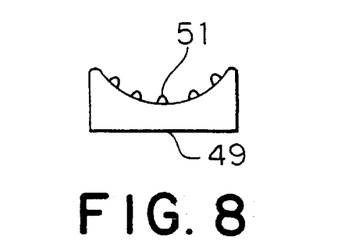
FIG. 8 is a plan view of a knob of the electrical jumper connector unit according to the embodiment of this invention.

The middle shell 37 has a pair of hooks 57 at both front edges thereof, and a pair of openings 59 at both sides thereof, as shown in FIG. 7. A rectangular frame-shaped plate 47 made of stainless steel is contained in both of the middle shell 37 and the upper shell 39. The connector 41 is fixed to a front side of the rectangular frame-shaped plate 47. A pair of knobs 49 is attached to both sides of the rectangular frame-shaped plate 47. There is a rugged concave surface 51 on each knob 49, as shown in FIG. 8. A pair of hooks 57 prevents the rectangular frame-shaped plate 47 from protruding out of the front of the middle shell 37. A pair of knobs 49 attached to both sides of the rectangular frame-shaped plate 47 protrudes from a pair of the openings 59 of the middle shell 37. The upper shell 39 has a pair of hooks (not shown) and openings. The upper shell 39 covers the rectangular frame-shaped plate 47. When an operator moves a pair of the knobs 49 by holding between his thumb and index finger, each rugged concave surface 51 of the knobs 49 prevents his finger from slipping.

When a pair of the knobs 49 moves in any directions within a predetermined range to the shell 33, the connector 41 moves with the plate 47 in the same way. When the connector 41 agrees with the external output connector 17 fixed on the electronic circuit board 13, a pair of the knobs 49 discontinues to move.

Figure 9:
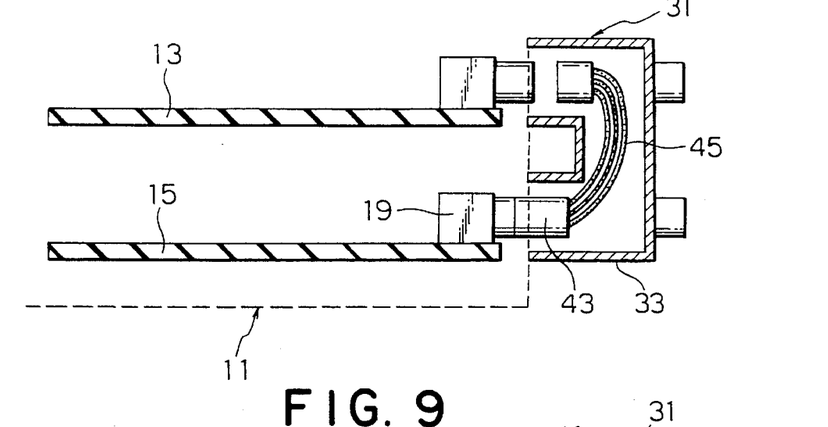
FIG. 9 is a vertical sectional view of the electrical jumper connector unit according to the embodiment of this invention and the information processing apparatus at the first stage of installation.
Figure 10:
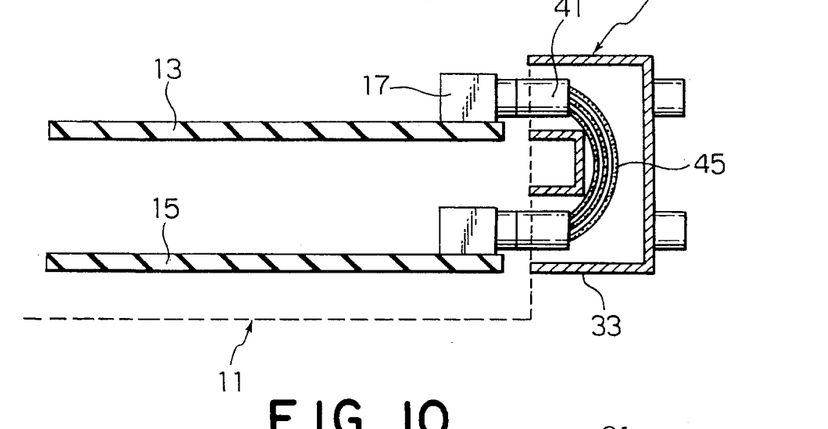
FIG. 10 is a vertical sectional view of the electrical jumper connector unit according to the embodiment of this invention and the information processing apparatus at the second stage of installation.
Figure 11:
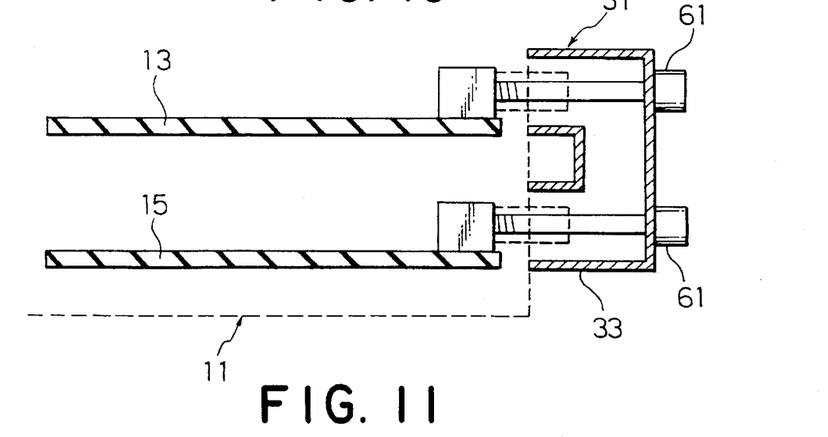
FIG. 11 is a vertical sectional view of the electrical jumper connector unit according to the embodiment of this invention and the information processing apparatus at the third stage of installation.

There are illustrated order of installation or connection of the electrical jumper connector unit 31 to the information processing apparatus 11 in FIGS. 9, 10, and 11.

The connector 43 is first connected to the external output connector 19, as shown in FIG. 9.

Then the connector 41 is connected to the external output connector 17, as shown in FIG. 10.

The conductive shell 33 is fastened to the information processing apparatus 11 by means of four screws 61 finally, as shown in FIG. 11.

Thus the electrical jumper connector unit 31 copes with a positioning error of the electronic circuit boards 13 and 15 in the information processing apparatus 11, and the connectors 41 and 43 can connect the external output connectors 17 and 19.

The plural discrete cables 45 connect between the two connectors 41 and 43 shortestly. This renders the electrical jumper connector unit 31 more compact and safe. Further, the electrical jumper connector unit 31 can cope with electromagnetic noises by adoption of the conductive shell 33 covering the plural discrete cables 45.

What is claimed is:

1. An electrical jumper connector unit for connecting two electronic circuit boards included in an information processing apparatus, said electrical jumper connector unit comprising a shell, a first connector fixedly mounted in said shell, a plate included in and supported by said shell, said plate being movable within a single plane within a predetermined moving range within said shell, a second connector disposed in said shell and fixedly mounted on said plate, plural loose cables connecting both of said first and second connectors to each other and extending within said shell, and knobs fixed to said plate and protruding from said shell for moving said plate to carry out a positional adjustment of said second connector.

2. An electrical jumper connector unit as claimed in claim 1, said plate comprising a rectangular frame-shaped member.

3. An electrical jumper connector unit as claimed in claim 1, said shell comprising a conductive member.

4. An electrical jumper connector unit as claimed in claim 1, further comprising screws for fastening of said shell to said information processing apparatus.

5. An electrical jumper connector unit as claimed in claim 1, said each of said knobs comprising a member with a rugged surface.

6. An electrical jumper connector unit for electrically connecting between two external electrical connector elements mounted in an electronic apparatus, said unit comprising:

a metallic shell;

a first electrical connector element fixedly mounted in said metallic shell and mating with a first one of said two external electrical connector elements;

a supporting frame mounted in said metallic shell to be movable within a single plane within a predetermined moving distance;

a second electrical connector element supported by said supporting frame to be movable together with said supporting frame in said metallic shell and mating with a second one of said two external electrical connector elements;

a bundle of electrical conductors contained in said metallic shell and connecting between said first and said second connector elements; and manipulating elements fixed to said supporting frame and extending from said supporting frame outside said metallic shell for manually moving said second connector element together with said supporting frame so as to adjust said second electrical connector elements into alignment with said second external electrical element after connection of said first electrical connector element with said first external electrical connector element.

7. An electrical jumper connector unit as claimed in claim 6, wherein said metallic shell has a front open end, said first and said second electrical connector elements are disposed to be exposed from said front open end.

8. An electrical jumper connector unit as claimed in claim 7, wherein said supporting frame is provided with a pair of knobs protruding from opposite side surfaces thereof as said manipulating elements, said metallic shell being provided with a pair of apertures in opposite sides thereof, said knobs being loosely fitted into, and extending outwardly through, said apertures, respectively, to thereby movably support said supporting frame in said metallic shell.

9. An electrical jumper connector unit as claimed in claim 8, wherein each of said knobs is provided with a top rugged surface to generate friction with a finger of a user during manipulation of the knob.

10. An electrical jumper connector unit as claimed in claim 8, wherein said metallic shell is provided with flanges extending inwardly from both edges of said front open side for engaging with said second electrical connector element to prevent said second electrical connector element from excessively projecting from said metallic shell through said front open side.

* * * * *